(12) United States Patent
Heo et al.

(10) Patent No.: US 8,624,123 B2
(45) Date of Patent: Jan. 7, 2014

(54) PRINTED CIRCUIT BOARD

(75) Inventors: Cheol Ho Heo, Busan (KR); Young Ki Lee, Gyunggi-do (KR); Sang Hyun Shin, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 282 days.

(21) Appl. No.: 13/102,323

(22) Filed: May 6, 2011

(65) Prior Publication Data

US 2012/0199381 A1 Aug. 9, 2012

(30) Foreign Application Priority Data

Feb. 8, 2011 (KR) ........................ 10-2011-0011197

(51) Int. Cl.
*H05K 1/00* (2006.01)
*H05K 7/20* (2006.01)

(52) U.S. Cl.
CPC .................................... *H05K 7/205* (2013.01)
USPC ........................................ 174/252; 174/260

(58) Field of Classification Search
CPC .................................................... H05K 7/205
USPC .......... 174/252, 255–260; 361/697, 688, 704, 361/709, 760, 762
See application file for complete search history.

(56) References Cited

U.S. PATENT DOCUMENTS

| 8,198,539 | B2 * | 6/2012 | Otoshi et al. .................. 174/252 |
| 2009/0141427 | A1 * | 6/2009 | Lyoo et al. .................. 361/321.4 |
| 2009/0278162 | A1 * | 11/2009 | Wang et al. ..................... 257/99 |
| 2012/0146494 | A1 * | 6/2012 | Nakayama et al. ........... 313/512 |

FOREIGN PATENT DOCUMENTS

| JP | 56-74994 A | 6/1981 |
| JP | 2000-174179 A | 6/2000 |
| JP | 2010-062172 A | 3/2010 |
| JP | 2010062172 | * 3/2010 |
| KR | 10-2009-0001849 A | 1/2009 |
| KR | 10-0953857 B | 4/2010 |

OTHER PUBLICATIONS

Office Action dated Oct. 16, 2012 for related JP App. No. 2011-103588 and its English summary.
Office Action dated Apr. 27, 2012 for related Korean App. No. 10-2011-0011197 and its English summary.

* cited by examiner

*Primary Examiner* — Yuriy Semenenko
(74) *Attorney, Agent, or Firm* — Ladas & Parry, LLP

(57) ABSTRACT

The present invention relates to a printed circuit board. A heat radiation coating material is applied to a portion of a circuit layer formed on an outermost portion of the printed circuit board, thereby making it possible to improve heat radiation performance of the printed circuit board. The heat radiation coating material also serves as a solder resist, thereby making it possible to insulate and protect the printed circuit board without a separate solder resist.

6 Claims, 1 Drawing Sheet

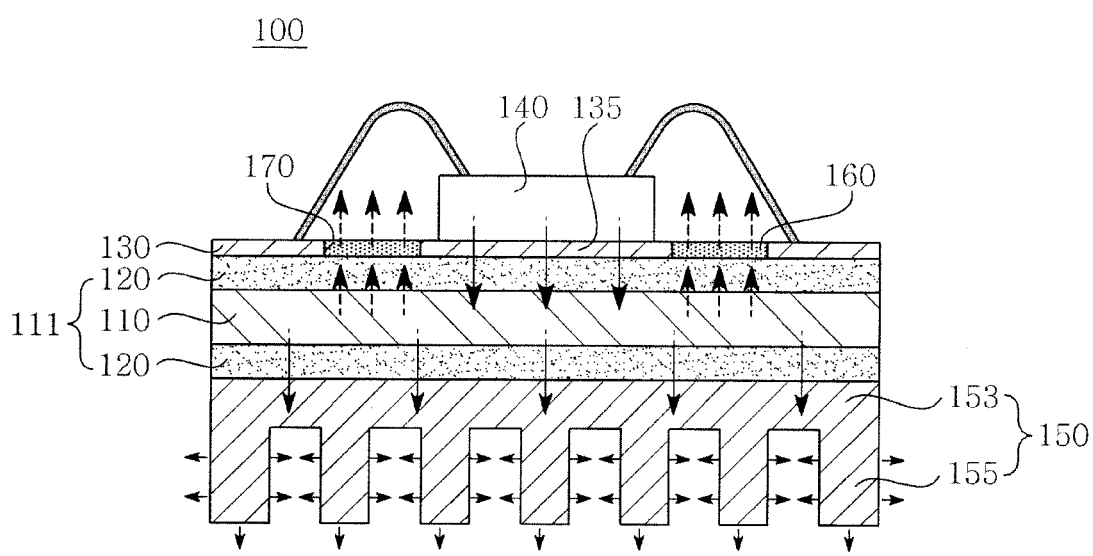

PRINTED CIRCUIT BOARD

CROSS REFERENCE TO RELATED APPLICATION

This application claims the benefit of Korean Patent Application No. 10-2011-0011197, filed on Feb. 8, 2011, entitled "Printed Circuit Board", which is hereby incorporated by reference in its entirety into this application.

BACKGROUND OF THE INVENTION

1. Technical Field

The present invention relates to a printed circuit board.

2. Description of the Related Art

Recently, a trend of multifunctional and high-speed electronic products has progressed at a rapid speed. In order to cope with this trend, a heating element such as a semiconductor chip and a printed circuit board mounted with the heating element connecting the heating element to a main substrate have also been developed at a very rapid speed. This trend is closely related to the trend of high-speed and high-density printed circuit boards. In order to satisfy them, significant performance improvement and development with respect to the slimness and lightness, the fine circuit, the high reliability, and the high-speed signal transfer structure of the printed circuit board are demanded.

Meanwhile, in accordance with the development of the printed circuit board, more electronic products are mounted on the printed circuit board. A considerable amount of heat is generated in the printed circuit board due to the increase in the number of the mounted electronic products and the density thereof. Therefore, research into a printed circuit board capable of rapidly radiating heat generated from the heating element, etc., has been conducted.

The printed circuit board according to the prior art has been basically configured of a base substrate including an insulating layer and an inner circuit layer, and a heating element mounted on the base substrate. In this configuration, heat generated from the heating element was radiated to the outside through the base substrate. Therefore, the heating element formed on the base substrate was not applied with high heat, thereby making it possible to prevent the performance of the heating element from being degraded.

However, in the case of the printed circuit board according to the prior art, the heat generated from the heating device was conducted to the base substrate in direct contact with the heating element and was then radiated to the outside of the printed circuit board. That is, the heat generated from the heating device was radiated through only a single moving path. Taking into consideration of the trend of slimness and lightness of the printed circuit board and the trend of increasing the number and density of electronic components mounted on the printed circuit board, there was a limitation in heat conduction capability of the base substrate, which has an influence on the circuit layer and the heating element formed on the printed circuit board, thereby deteriorating the entire reliability of a product.

SUMMARY OF THE INVENTION

The present invention has been made in an effort to provide a printed circuit board in which a coating material having heat radiation characteristics is applied to an outermost circuit layer to prevent short-circuit and corrosion of the outermost circuit layer of the printed circuit board and a radiation path of heat generated from a heating element is additionally provided to thereby further improve heat-radiation performance.

According to a preferred embodiment of the present invention, there is provided a printed circuit board including: a base substrate; a circuit layer formed on one surface of the base substrate and including an opening formed therein; and a heat radiation coating material applied to the opening to thereby radiate heat generated from the base substrate to the outside.

The printed circuit board may further include a heat sink attached to the other surface of the base substrate.

The printed circuit board may further include a heating element attached to one surface of the base substrate.

The base substrate may include: a core layer; and an insulating layer formed on one surface or both surfaces of the core layer.

The core layer may be made of a metal.

The core layer may be made of a ceramic.

The heat radiation coating material may be made of an organic material and a ceramic filler.

The ceramic filler may be made of alumina ($Al_2O_3$), a carbon nanotube (CNT), boron nitride (BN), or a combination thereof.

BRIEF DESCRIPTION OF THE DRAWINGS

FIG. 1 is a cross-sectional view of a printed circuit board according to a preferred embodiment of the present invention.

DESCRIPTION OF THE PREFERRED EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

FIG. 1 is a cross-sectional view of a printed circuit board according to a preferred embodiment of the present invention.

A printed circuit board 100 according to a preferred embodiment of the present invention is configured to include a base substrate 111, a circuit layer 130 formed on one surface of the base substrate 111 and including an opening 170 formed therein, a heat radiation coating material 160 applied to the opening 170 to thereby radiate heat generated from the base substrate 111 to the outside, and a heat sink 150 formed on the other surface of the base substrate 111.

The base substrate 111 is configured of a core layer 110 and an insulating layer 120 formed on one surface or both surfaces of the core layer 110.

The core layer 110, which is a basic component of the printed circuit board 100, basically improves the strength of the printed circuit board 100. The core layer 110 may be made of various metals such as copper (Cu), aluminum (Al), magnesium (Mg), titanium (Ti), hafnium (Hf), zinc (Zn), etc., or a ceramic such as aluminum nitride (AlN), etc. However, the material of the core layer 110 is not specifically limited. Meanwhile, the insulating layer 120 is formed on one surface or both surface of the core layer 110. The insulating layer 120 may be made of an insulating material generally used for the printed circuit board 100. As the insulating material, for example, a complex polymer resin such as prepreg (PPG), an epoxy based resin such as FR-4, BT, etc, an Ajinomoto build-up film (ABF), etc., may be used. However, the material of the insulating layer is not specifically limited thereto. That is, all insulating materials known in the art may be used. Meanwhile, the insulating layer may be made of a liquid state insulating material or a film type insulating material.

For example, the core layer 110 configuring the base substrate 111 according to the present invention may be made of aluminum (Al). In this case, the insulating layer 120 may be made of alumina ($Al_2O_3$). The alumina is an insulating material formed to be closely adhered to a surface of aluminum by an anodizing reaction of aluminum. The aluminum is a light material, thereby making it possible to reduce the entire weight of the printed circuit board 100.

Meanwhile, although FIG. 1 shows a case in which the base substrate 111 is configured of the single core layer 110 and the insulating layer 120, the present invention is not limited thereto. The base substrate 111 may also be configured of a build-up layer including a plurality of insulating layers 120, a circuit board 130, and a via (not shown).

The circuit layer 130 is formed on the insulating layer 120 configuring the base substrate 111 and has a predetermined pattern. The circuit layer 130 has the opening 170 formed therein, and includes a pad part 135. The pad part 135 is a portion on which a heating element 140 is mounted. The heating element 140 may be mounted on the pad part 135 or may be in direct contact with the insulating layer 120 exposed by the opening 170. The circuit layer 130 may be made of an electrical conductive metal such as gold, silver, copper, nickel, etc., and may be generally made of copper without being specifically limited.

The heat radiation coating material 160 is applied to the opening 170 in the circuit layer 130, thereby making it possible to simultaneously perform a solder resist function and a heat radiation function. That is, the heat radiation coating material 160 has both of the insulation and the heat radiation characteristics. The heat radiation coating material 160 is made of an organic material and a ceramic filler. Here, the ceramic filler is made of alumina ($Al_2O_3$), a carbon nanotube (CNT), boron nitride (BN), or a combination of at least one thereof. The carbon nanotube (CNT) has excellent thermal conductivity to thereby serve to improve the heat radiation characteristics of the heat radiation coating material 160. In addition, the boron nitride (BN), which is a material having excellent thermal conductivity, heat resistance, etc., is added to components of the heat radiation coating material 160 to improve the heat radiation characteristics of the printed circuit board 100. Further, the heat radiation coating material 160 has a property in which it does not react with various chemical substances (for example, lead) and has excellent insulation characteristics, such that it may be substituted for a solder resist protecting the printed circuit board 100 and insulating between portions in the circuit board 130.

The heat radiation coating material 160 is formed on the insulating layer 120 or the pad part 135, and is applied around the heating element 140 to electrically insulate the heating element 140 from the circuit board 130 and to radiate heat generated from the base substrate 111 or the heating element 140 to the outside of the printed circuit board 100 through heat conduction or heat radiation, thereby making it possible to improve the performance or the lifespan of the printed circuit board 100. Since the heat radiation coating material 160 is in direct contact with the heating element 140 or is in indirect contact with the heating element 140 in the vicinity of the heating element 140 through the pad part 135, it has higher heat radiation efficiency, as compared to heat conduction and heat radiation through the heat sink 150 described below. That is, a portion of heat conducted to the core layer 110 is discharged to the outside of the printed circuit board 100 through the heat radiation coating material 160, thereby making it possible to supplement a limitation in heat radiation of the heat sink 150.

The heat sink 150 is attached to the other surface of the base substrate 111 to radiate the heat generated from the heating element 140 or the base substrate 111 to the outside of the printed circuit board 100. That is, the heat generated from the heating element 140 is conducted to the base substrate 111, and the heat sink 150 radiates the heat conduced to the base substrate 111 to the outside of the printed circuit board 100. Therefore, heat exchange may be smoothly performed between the printed circuit board 100 and the heat sink 150. The heat sink 150 may be formed to include a flat plate shaped base part 153 and a heat radiation pin 155 formed to protrude in a protrusion shape on one surface of the base part 153. The heat sink 150 having this shape increases an exposure area, thereby making it possible to improve heat radiation efficiency.

The heat generated from the heating element 140 is conducted through the pad part 135 (or the insulating layer 120 in the case in which the heating element 140 is directly mounted on the insulating layer 120), and the heat conducted to the insulating layer 120 through the pad part 135 arrives at the core layer 110 (shown as a solid line). The printed circuit board 100 according to the preferred embodiment of the present invention radiates the heat through the following path.

First, as described above, the heat conducted to the base substrate 111 is radiated to the outside of the printed circuit board 100 through the heat sink 150 attached to the other surface of the base substrate 111 (shown in a solid line). The heat is more effectively radiated through the base part 153 configuring the heat sink 150 and the protrusion-shaped heat radiation pin 155 extended and protruded from the base part 153 to have a wide surface area.

Meanwhile, the heat conducted to the base substrate 111 is radiated through the heat radiation coating material 160 applied to the opening 170 in the circuit layer 130 (shown as a dot line). A heat radiation path through the heat radiation coating material 160 corresponds to a technical characteristic of the present invention. A portion of the heat conducted to the base substrate 111 is radiated to the outside of the printed circuit board 100 through the heat radiation coating material 160, thereby making it possible to supplement a limitation in heat radiation of the heat sink 150.

According to the present invention, the heat radiation coating material is applied to a portion of the circuit layer formed on an outermost portion of the printed circuit board, thereby making it possible to improve the heat radiation performance of the printed circuit board In addition, according to the present invention, the heat radiation coating material also serves as the solder resist, thereby making it possible to insulate and protect the printed circuit board without a separate solder resist.

Although the preferred embodiments of the present invention have been described in detail, they are for specifically explaining the present invention and thus a printed circuit board according to the present invention is not limited thereto, but those skilled in the art will appreciate that modifications and alteration are possible, without departing from the scope and spirit of the invention.

Accordingly, such modifications and alterations should also be understood to fall within the scope of the present invention and a specific scope of the present invention will be defined by the following claims.

What is claimed is:

1. A printed circuit board comprising:
   a base substrate;
   a heating element attached to one surface of the base substrate;
   a circuit layer formed on one surface of the base substrate and including a pad part on which the heating element is mounted and an opening formed on one side or both sides of the pad part;
   a heat sink attached to another surface of the base substrate; and
   a heat radiation coating material applied to the opening to thereby radiate heat of the heating element conducted to the base substrate to outside.

2. The printed circuit board as set forth in claim 1, wherein the base substrate includes:
   a core layer; and
   an insulating layer formed on one surface or both surfaces of the core layer.

3. The printed circuit board as set forth in claim 2, wherein the core layer is made of a metal.

4. The printed circuit board as set forth in claim 2, wherein the core layer is made of a ceramic.

5. The printed circuit board as set forth in claim 1, wherein the heat radiation coating material is made of an organic material and a ceramic filler.

6. The printed circuit board as set forth in claim 5, wherein the ceramic filler is made of alumina ($Al_2O_3$), a carbon nanotube (CNT), boron nitride (BN), or a combination thereof.

* * * * *